United States Patent
Noda et al.

(10) Patent No.: US 11,258,232 B2
(45) Date of Patent: Feb. 22, 2022

(54) LIGHT EMITTER AND PROJECTOR

(71) Applicant: Seiko Epson Corporation, Tokyo (JP)

(72) Inventors: Takafumi Noda, Matsumoto (JP); Yoji Kitano, Chino (JP)

(73) Assignee: Seiko Epson Corporation

( * ) Notice: Subject to any disclaimer, the term of this patent is extended or adjusted under 35 U.S.C. 154(b) by 68 days.

(21) Appl. No.: 16/607,549

(22) PCT Filed: Apr. 16, 2018

(86) PCT No.: PCT/JP2018/015666
§ 371 (c)(1),
(2) Date: Oct. 23, 2019

(87) PCT Pub. No.: WO2018/198849
PCT Pub. Date: Nov. 1, 2018

(65) Prior Publication Data
US 2020/0076160 A1 Mar. 5, 2020

(30) Foreign Application Priority Data
Apr. 24, 2017 (JP) .............................. JP2017-085079

(51) Int. Cl.
*H01S 5/22* (2006.01)
*H01S 5/042* (2006.01)
(Continued)

(52) U.S. Cl.
CPC .......... *H01S 5/2205* (2013.01); *H01S 5/0261* (2013.01); *H01S 5/0422* (2013.01); *H01S 5/06808* (2013.01); *H01S 5/32* (2013.01)

(58) Field of Classification Search
CPC .... H01S 5/2205; H01S 5/0261; H01S 5/0422; H01S 5/06808; H01S 5/32; H01S 5/04256; H01S 5/18319
See application file for complete search history.

(56) References Cited

U.S. PATENT DOCUMENTS 6,316,785 B1 * 11/2001 Nunoue .................. H01L 33/32
257/14
2005/0271107 A1 12/2005 Murakami et al.
(Continued)

FOREIGN PATENT DOCUMENTS

JP 2005-353647 A 12/2005
JP 2012-056015 A 3/2012
(Continued)

*Primary Examiner* — Yuanda Zhang
(74) *Attorney, Agent, or Firm* — Harness, Dickey & Pierce, P.L.C.

(57) ABSTRACT

A light emitter includes a substrate, a first semiconductor layer having a first conductivity type, a second semiconductor layer having a second conductivity type different from the first conductivity type, a light emitting layer provided between the first semiconductor layer and the second semiconductor layer and capable of emitting light when current is injected into the light emitting layer, and a third semiconductor layer provided between the substrate and the first semiconductor layer and having the second conductivity type, in which the first semiconductor layer is provided between the third semiconductor layer and the light emitting layer, and the third semiconductor layer has a protruding/recessed structure.

19 Claims, 7 Drawing Sheets

(51) Int. Cl.
*H01S 5/068* (2006.01)
*H01S 5/32* (2006.01)
*H01S 5/026* (2006.01)

(56) References Cited

U.S. PATENT DOCUMENTS

| | | |
|---|---|---|
| 2006/0284187 A1 | 12/2006 | Wierer et al. |
| 2008/0002748 A1* | 1/2008 | Masui .................. B82Y 20/00 |
| | | 372/45.01 |
| 2008/0048194 A1 | 2/2008 | Kudo et al. |
| 2009/0161715 A1* | 6/2009 | Asada .................. H01S 5/0421 |
| | | 372/45.01 |
| 2016/0190385 A1 | 6/2016 | Nishioka |

FOREIGN PATENT DOCUMENTS

| | | |
|---|---|---|
| JP | 2013-009002 A | 1/2013 |
| JP | 2013-222746 A | 10/2013 |
| JP | 2016-122705 A | 7/2016 |
| WO | WO-2005-064664 A1 | 7/2005 |
| WO | WO-2005-122290 A1 | 12/2005 |

\* cited by examiner

LIGHT EMITTER AND PROJECTOR

The entire disclosure of Japanese Patent Application No. 2017-085079 filed on Apr. 24, 2017 is expressly incorporated by reference herein.

BACKGROUND

Technical Field

The present invention relates to a light emitter and a projector.

Related Art

A semiconductor laser is expected as a high-luminance, next-generation light source and is used, for example, as the light source of a projector.

For example, JP-A-2013-9002 describes a semiconductor light emitter including n-type posts that each form a photonic crystal, a planar n-type area (n-type semiconductor layer) disposed on the n-type posts, a light emitting area (light emitting layer), and a p-type area (p-type semiconductor layer).

In the light emitter described in JP-A-2013-9002, however, for example, an attempt to inject current into the light emitting layer via a first electrode electrically coupled to the n-type semiconductor layer and a second electrode electrically coupled to the p-type semiconductor layer causes leakage current to flow through the n-type posts in some cases because the n-type posts and the n-type semiconductor layer have the same conductivity type.

An object according to some aspects of the invention is to provide a light emitter capable of suppressing leakage current. Another object according to some aspects of the invention is to provide a projector including the light emitter.

SUMMARY

A light emitter according to the invention includes
a substrate,
a first semiconductor layer having a first conductivity type,
a second semiconductor layer having a second conductivity type different from the first conductivity type,
a light emitting layer provided between the first semiconductor layer and the second semiconductor layer and capable of emitting light when current is injected into the light emitting layer, and
a third semiconductor layer provided between the substrate and the first semiconductor layer and having the second conductivity type,
in which the first semiconductor layer is provided between the third semiconductor layer and the light emitting layer, and
the third semiconductor layer has a protruding/recessed structure.

In the light emitter described above, a PN junction can be formed between the first semiconductor layer and the third semiconductor layer, allowing suppression of leakage of current into the third semiconductor layer. The light emitter can therefore suppress leakage current.

The light emitter according to the invention may further include
a potential applicator that applies potential to the first semiconductor layer, the second semiconductor layer, and the third semiconductor layer.

In the light emitter described above, potential is applicable to the first semiconductor layer, the second semiconductor layer, and the third semiconductor layer.

In the light emitter according to the invention,
the first conductivity type may be a p type,
the second conductivity type may be an n type, and
the potential applicator may apply the potential in such a way that the potential at the first semiconductor layer is lower than or equal to the potential at the third semiconductor layer.

In the light emitter described above, the potential applicator can apply reverse bias to the space between the first semiconductor layer and the third semiconductor layer, whereby leakage current into the third semiconductor layer can be more reliably suppressed.

In the light emitter according to the invention,
the first conductivity type may be an n type,
the second conductivity type may be a p type, and
the potential applicator may apply the potential in such a way that the potential at the first semiconductor layer is higher than or equal to the potential at the third semiconductor layer.

In the light emitter described above, the potential applicator can apply reverse bias to the space between the first semiconductor layer and the third semiconductor layer, whereby leakage current into the third semiconductor layer can be more reliably suppressed.

The light emitter according to the invention may further include,
a fourth semiconductor layer provided between the third semiconductor layer and the first semiconductor layer.

In the light emitter described above, the amount of dislocation that occurs in the fourth semiconductor layer can be reduced, whereby the amount of dislocation that occurs in the first semiconductor layer, the light emitting layer, and the second semiconductor layer can be reduced.

In the light emitter according to the invention,
the protruding/recessed structure may include a plurality of protrusions, and
the protrusions may be coupled to the first semiconductor layer.

In the light emitter described above, the amount of dislocation that occurs in the first semiconductor layer, the light emitting layer, and the second semiconductor layer can be reduced.

A projector according to the invention includes the light emitter according to the invention.

The projector described above can include the light emitter according to the invention.

DETAILED DESCRIPTION

Preferable embodiments of the invention will be described below in detail with reference to the drawings. It is not intended that the embodiments described below unduly limit the contents of the invention set forth in the claims. Further, all configurations described below are not necessarily essential configuration requirements of the invention.

1. First Embodiment 1.1. Light Emitter

Figure 1:
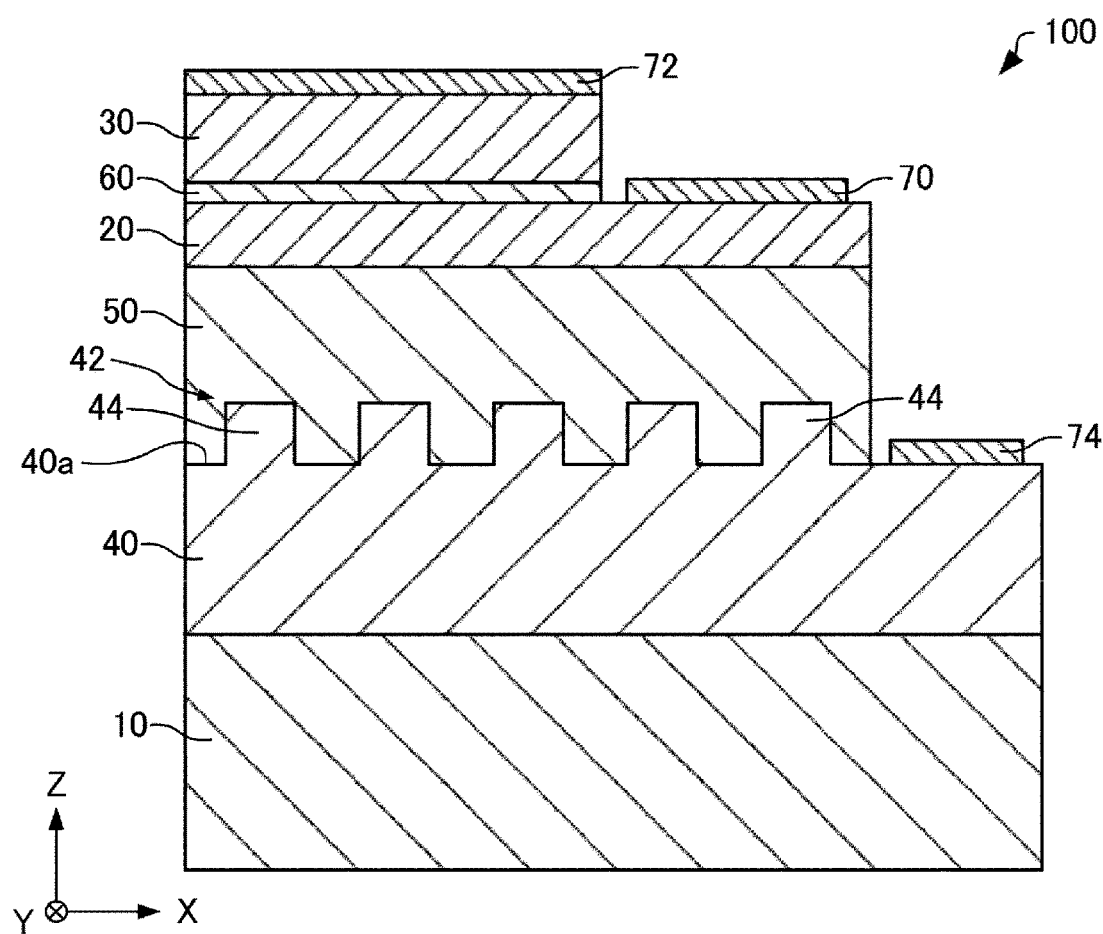
FIG. 1 is a cross-sectional view diagrammatically showing a light emitter according to a first embodiment.
Figure 2:
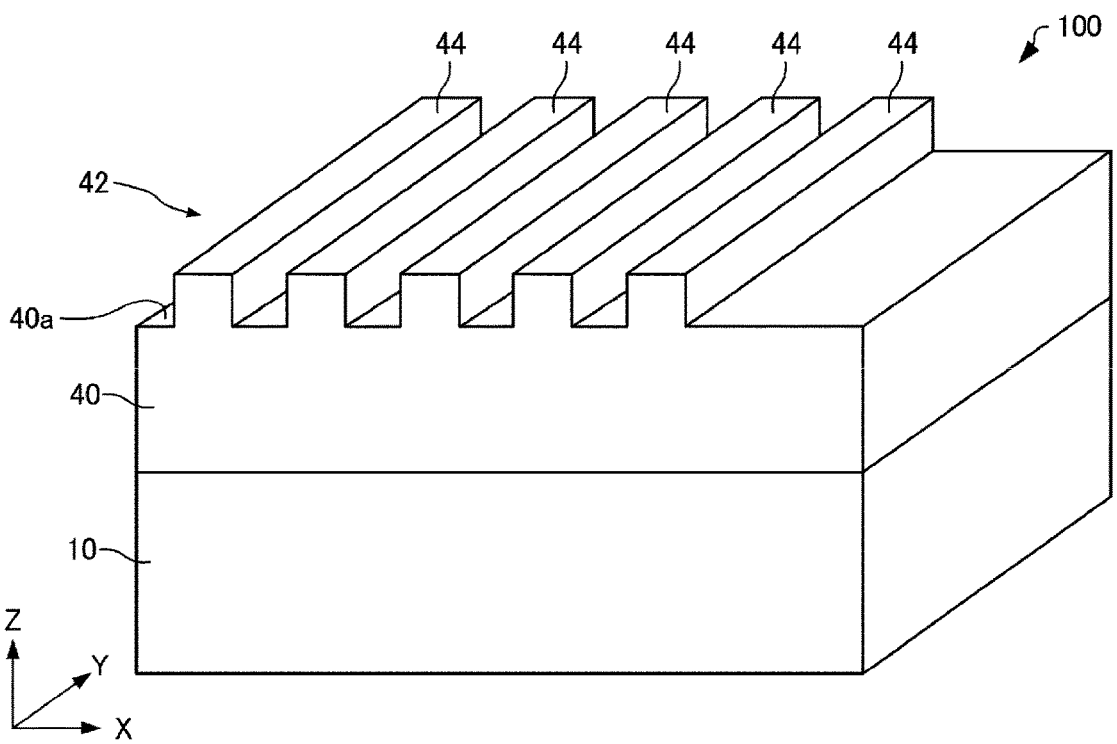
FIG. 2 is a perspective view diagrammatically showing the light emitter according to the first embodiment.

A light emitter according to a first embodiment will first be described with reference to the drawings. FIG. 1 is a cross-sectional view diagrammatically showing a light emitter 100 according to the first embodiment. FIG. 2 is a perspective view diagrammatically showing the light emitter 100 according to the first embodiment. In FIGS. 1 and 2, axes X, Y, and Z are drawn as three axes perpendicular to one another.

The light emitter 100 includes, for example, a substrate 10, a first semiconductor layer 20, a second semiconductor layer 30, a third semiconductor layer 40, a fourth semiconductor layer 50, a light emitting layer 60, a first electrode 70, a second electrode 72, and a third electrode 74, as shown in FIGS. 1 and 2. In FIG. 2, the semiconductor layers 20, 30, and 50, the light emitting layer 60, and the electrodes 70, 72, and 74 are omitted for convenience.

The substrate 10 has, for example, a plate-like shape. The substrate 10 is, for example, an Si substrate or a sapphire substrate.

The third semiconductor layer 40 is provided above the substrate 10. The third semiconductor layer 40 is provided between the substrate 10 and the first semiconductor layer 20. In the example shown in FIG. 1, the third semiconductor layer 40 is separate from the first semiconductor layer 20. The third semiconductor layer 40 is, for example, a GaN layer having a second conductivity type (p-type, for example) different from a first conductivity type (specifically, GaN layer to which Mg is doped).

The third semiconductor layer 40 has a protruding/recessed structure 42. The protruding/recessed structure 42 is provided along an upper surface 40a of the third semiconductor layer 40. The protruding/recessed structure 42 includes a plurality of protrusions 44. In the example shown in FIGS. 1 and 2, the protrusions 44, which form the protruding/recessed structure 42, each have a box-like shape. The protrusions 44 are each so shaped that the size in the axis-Y direction is greater than the size in the axis-X direction, and the plurality of protrusions 44 are periodically arranged in the axis-X direction. The size of the protrusions 44 in the axis-X direction is, for example, greater than or equal to 5 nm but smaller than or equal to 5 μm. The plurality of protrusions 44 are provided, for example, in the form of stripes in a plan view (when viewed in layering direction in which first semiconductor layer 20 and light emitting layer 60 are layered on each other).

In the invention, the term "above" refers to a side in the layering direction that is the side away from the substrate 10 when viewed from the side facing the light emitting layer 60, and the term "below" refers to a side in the layering direction that is the side closer to the substrate 10 when viewed from the side facing the light emitting layer 60.

The fourth semiconductor layer 50 is provided above the third semiconductor layer 40. The fourth semiconductor layer 50 is provided between the third semiconductor layer 40 and the first semiconductor layer 20. The fourth semiconductor layer 50 is so provided as to fill the recesses of the protruding/recessed structure 42. The fourth semiconductor layer 50 is, for example, a GaN layer having the second conductivity type (p-type, for example) (specifically, GaN layer to which Mg is doped). The fourth semiconductor layer is, for example, electrically coupled to the third semiconductor layer 40.

The first semiconductor layer 20 is provided above the fourth semiconductor layer 50. The first semiconductor layer 20 is provided between the third semiconductor layer 40 and the light emitting layer 60. The first semiconductor layer 20 has, for example, the first conductivity type (n type, for example). The first semiconductor layer 20 is, for example, a distributed Bragg reflection-type (DBR-type) mirror layer in which a high refractive index layer and a low refractive index layer are alternately layered on each other. The high refractive index layer and the low refractive index layer of the first semiconductor layer 20 are each, for example, an n-type InGaN layer to which Si is doped. For example, the composition proportion of In in the high refractive index layer is greater than the composition proportion of In in the low refractive index layer. The refractive index of the high refractive index layer can thus be higher than the refractive index of the low refractive index layer.

The light emitting layer 60 is provide above the first semiconductor layer 20. The light emitting layer 60 is provided between the first semiconductor layer 20 and the second semiconductor layer 30. The light emitting layer 60 is a layer capable of emitting light when current is injected thereinto. The light emitting layer 60 has, for example, a quantum well structure formed of a GaN layer and an InGaN layer.

The second semiconductor layer 30 is provided above the light emitting layer 60. The second semiconductor layer 30 has, for example, the second conductivity type (p type, for example). The second semiconductor layer 30 is, for example, a distributed Bragg reflection-type (DBR-type) mirror layer in which a high refractive index layer and a low refractive index layer are alternately layered on each other. The high refractive index layer and the low refractive index layer of the second semiconductor layer 30 are each, for example, a p-type InGaN layer to which Mg is doped.

In the light emitter 100, the p-type first semiconductor layer 20, the light emitting layer 60 to which no impurity is doped, and the n-type second semiconductor layer 30 form a vertical-cavity-type pin diode. In the light emitter 100, when forward bias voltage for the pin diode is applied to the space between the first electrode 70 and the second electrode 72 (when current is injected into light emitting layer 60), electrons and holes recombine with each other in the light emitting layer 60 to cause light emission. The light produced in the light emitting layer 60 travels back and forth between the first semiconductor layer 20 and the second semiconductor layer 30 (undergoes multiple reflection), which causes induced emission, whereby the intensity of the light is amplified. When the optical gain exceeds optical loss in the induced emission, laser oscillation occurs, and laser light exits via the upper surface of the second semiconductor layer 30 in the vertical direction (direction in which first semiconductor layer 20 and light emitting layer 60 are layer on each other). The light emitter 100 is, for example, a vertical cavity surface emitting laser (VCSEL).

The first electrode 70 is provided above the first semiconductor layer 20. The first electrode 70 is electrically coupled to the first semiconductor layer 20. The first electrode 70 is one of the electrodes for injecting the current into the light emitting layer 60. The first electrode 70 is, for example, an electrode for applying potential to the first semiconductor layer 20. The first electrode 70 is, for example, a laminate of an Ni layer and an Au layer layered in the presented order from the side facing the first semiconductor layer 20.

Although not shown, a first contact layer may be provided between the first electrode 70 and the first semiconductor layer 20. The first contact layer may be in ohmic contact with the first electrode 70. The first contact layer may be a p-type GaN layer.

The second electrode 72 is provided above the second semiconductor layer 30. The second electrode 72 is electrically coupled to the second semiconductor layer 30. The second electrode 72 is the other one of the electrodes for injecting the current into the light emitting layer 60. The second electrode 72 is, for example, an electrode for applying potential to the second semiconductor layer 30. The second electrode 72 is, for example, a transparent electrode made, for example, of ITO (indium tin oxide). The light emitted from the light emitting layer 60 is thus allowed to pass through the second electrode 72 and exits out thereof.

Although not shown, a second contact layer may be provided between the second electrode 72 and the second semiconductor layer 30. The second contact layer may be in ohmic contact with the second electrode 72. The second contact layer may be an n-type GaN layer.

The third electrode 74 is provided above the third semiconductor layer 40. The third electrode 74 is electrically coupled to the third semiconductor layer 40. The third electrode 74 is, for example, an electrode for applying potential to the third semiconductor layer 40. The material of the third electrode 74 is, for example, identical to the material of the first electrode 70.

Although not shown, a third contact layer may be provided between the third electrode 74 and the third semiconductor layer 40. The third contact layer may be in ohmic contact with the third electrode 74. The third contact layer may be an n-type GaN layer.

The light emitter 100 has, for example, the following features.

The light emitter 100 includes the first semiconductor layer 20 having the first conductivity type and the third semiconductor layer 40 having the second conductivity type and provided between the substrate 10 and the first semiconductor layer 20. Therefore, in the light emitter 100, a PN junction can be formed between the first semiconductor layer 20 and the third semiconductor layer 40 (by first semiconductor layer 20 and fourth semiconductor layer 50 in the example shown in FIG. 1). The light emitter 100 can therefore suppress leakage of the current flowing through the space between the first electrode 70 and the second electrode 72 into the third semiconductor layer 40. The light emitter 100 can therefore suppress leakage current. As a result, in the light emitter 100, the current can be stably injected into the light emitting layer 60 for stable laser oscillation. Further, the light emitter 100, which can suppress the leakage current into the third semiconductor layer 40, can suppress noise induced in the substrate 10.

Further, in the light emitter 100, the third semiconductor layer 40 has the protruding/recessed structure 42. Therefore, even when dislocation resulting from lattice strain occurs due, for example, to the fact that the lattice constant of the substrate 10 differs from the lattice constant of the third semiconductor layer 40, the dislocation can be concentrated in the vicinity of the corners of the protrusions 44, whereby the amount of dislocation that occurs in the fourth semiconductor layer 50 can be reduced as compared with a case where the third semiconductor layer 40 has no protruding/recessed structure 42. As a result, in the light emitter 100, the amount of dislocation that occurs in the light emitting layer 60 and the semiconductor layers 20 and 30 can be reduced, whereby the quality of the light emitting layer 60 and the semiconductor layers 20 and 30 can be increased. The light emitter 100 can therefore be characterized, for example, by high efficiency.

The light emitter 100 includes the fourth semiconductor layer 50 provided between the third semiconductor layer 40 and the first semiconductor layer 20. In the light emitter 100, the amount of dislocation that occurs in the fourth semiconductor layer 50 can be reduced, as described above, whereby the amount of dislocation that occurs in the light emitting layer 60 and the semiconductor layers 20 and 30 can be reduced.

The light emitter 100 includes the third electrode 74 electrically coupled to the third semiconductor layer 40. Therefore, in the light emitter 100, the potential of the fourth semiconductor layer 50, which is electrically coupled to the third semiconductor layer 40, can be lower, for example, than the potential of the first semiconductor layer 20, whereby the leakage current into the third semiconductor layer 40 can be more reliably suppressed.

Figure 3:
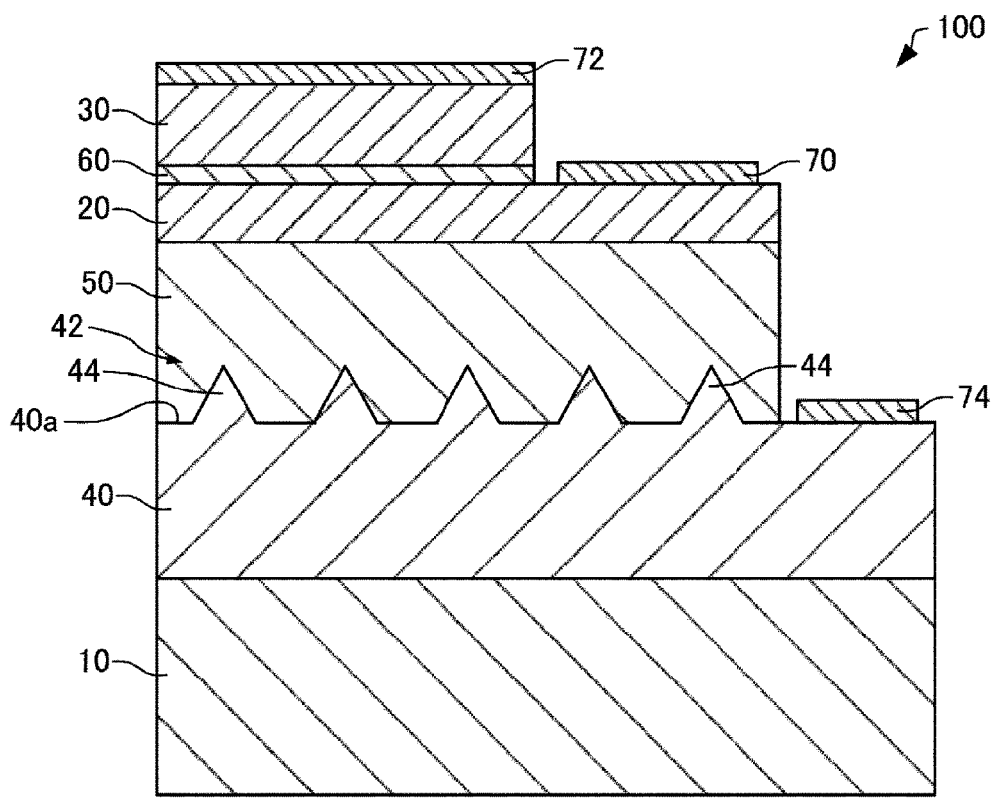
FIG. 3 is a cross-sectional view diagrammatically showing the light emitter according to the first embodiment.

In the example described above, the cross-sectional shape of each of the protrusions 44 taken along a plane parallel to the plane XZ is a quadrangular shape, but not necessarily, and may instead, for example, be a triangular shape, as shown in FIG. 3. Further, in the example described above, the plurality of protrusions 44 are provided in the form of stripes in the plan view and may instead be provided in the form of a lattice or dots in the plan view. In the case where the plurality of protrusions 44 are provided in the form of a lattice or dots, the protrusions 44 may each have a circular shape or a polygonal shape in the plan view.

The above description has been made of the case where the light emitter 100 is a surface emitting laser that outputs laser light in the vertical direction. The light emitter according to the invention may instead, for example, be an edge emitting laser that outputs laser light in the horizontal direction perpendicular to the vertical direction. In this case, the first semiconductor layer 20 and the second semiconductor layer 30 are each not a DBR mirror layer but are each, for example, a GaN layer and have the function of trapping the light in the light emitting layer 60 (suppressing leakage of light from light emitting layer 60).

1.2. Method for Manufacturing Light Emitter

Figure 4:
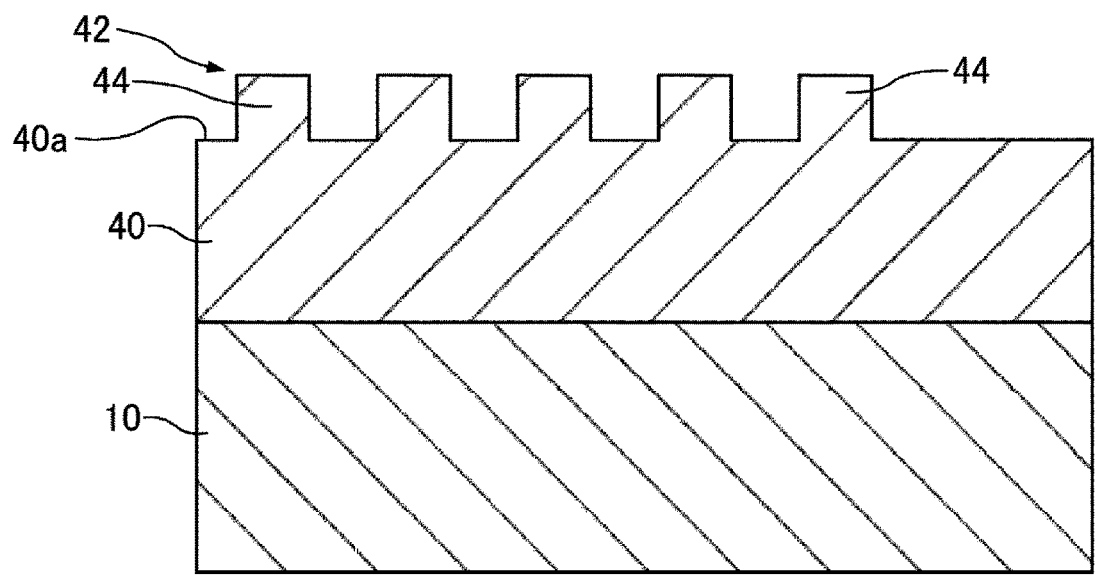
FIG. 4 is a cross-sectional view diagrammatically showing one of the steps of manufacturing the light emitter according to the first embodiment.
Figure 5:
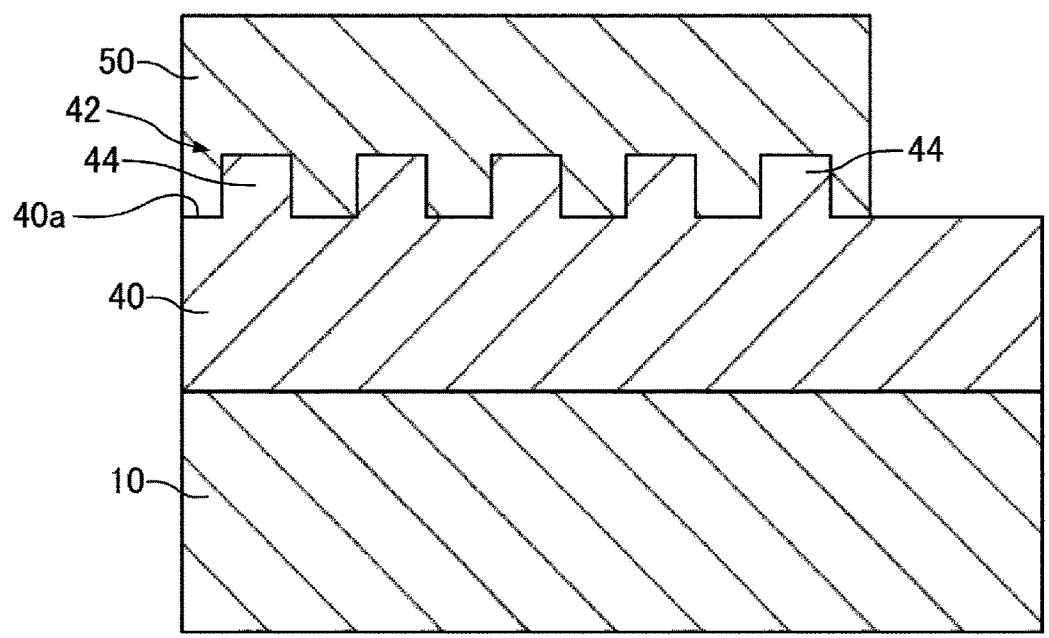
FIG. 5 is a cross-sectional view diagrammatically showing another of the steps of manufacturing the light emitter according to the first embodiment.

A method for manufacturing the light emitter 100 according to the first embodiment will next be described with reference to the drawings. FIGS. 4 and 5 are cross-sectional views diagrammatically showing steps of manufacturing the light emitter 100 according to the first embodiment.

The third semiconductor layer 40 is formed above the substrate 10 by epitaxial growth and patterning, as shown in FIG. 4. Examples of the epitaxial growth may include metal organic chemical vapor deposition (MOCVD) and molecular beam epitaxy (MBE). The patterning is performed, for example, by photolithography and etching. The third semiconductor layer 40 having the protruding/recessed structure 42 can thus be formed.

The protruding/recessed structure 42 of the third semiconductor layer 40 is not necessarily formed by photolithography and etching and may instead be formed by causing the third semiconductor layer 40 to undergo epitaxial growth with a mask layer that is not shown formed on the upper surface 40a.

The fourth semiconductor layer 50 is formed above the third semiconductor layer 40, as shown in FIG. 5. The fourth semiconductor layer 50 is formed, for example, by epitaxial lateral overgrowth (ELO) film formation using MOCVD, MBE, or any other method and patterning (patterning using photolithography and etching) the fourth semiconductor layer 50.

The first semiconductor layer 20, the light emitting layer 60, and the second semiconductor layer 30 are caused to undergo epitaxial growth in the presented order on the fourth semiconductor layer 50 by using MOCVD, MBE, or any other method, as shown in FIG. 1. The light emitting layer 60 and the second semiconductor layer 30 are formed, for example, by photolithography and etching in a predetermined area of the first semiconductor layer 20. The first electrode 70 is then formed above the first semiconductor layer 20, the second electrode 72 is formed above the second semiconductor layer 30, and the third electrode 74 is formed above the third semiconductor layer 40. The electrodes 70, 72, and 74 are formed, for example, by vacuum evaporation. The order in accordance with which the first electrode 70, the second electrode 72, and the third electrode 74 are formed is not limited to a specific order.

The light emitter 100 can be manufactured by carrying out the steps described above.

1.3. Variation of Light Emitter

Figure 6:
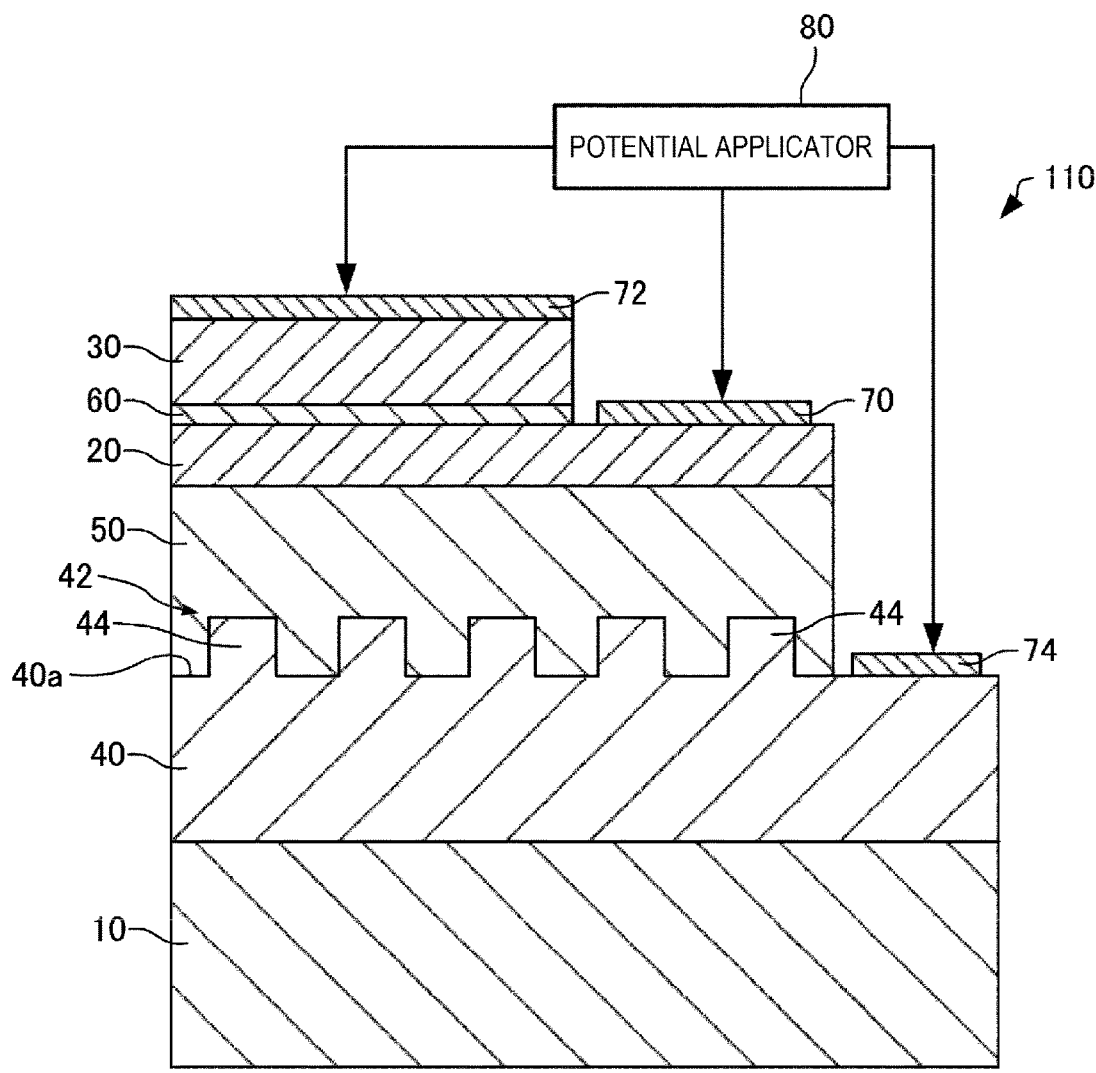
FIG. 6 diagrammatically shows a light emitter according to a variation of the first embodiment.

A light emitter according to a variation of the first embodiment will next be described with reference to the drawings. FIG. 6 diagrammatically shows a light emitter 110 according to the variation of the present embodiment.

In the following description, a member that forms the light emitter 110 according to the variation of the first embodiment and has a function similar to the function of a constituent member of the light emitter 100 according to the first embodiment described above has the same reference character and will not be described in detail.

The light emitter 110 differs from the light emitter 100 described above in that the light emitter 110 includes a potential applicator 80, as shown in FIG. 6. The potential applicator 80 is achieved, for example, by a drive circuit for driving the light emitter 110.

The potential applicator 80 applies potential to the first semiconductor layer 20, the second semiconductor layer 30, and the third semiconductor layer 40. When potential is applied to the first semiconductor layer 20, the second semiconductor layer 30, and the third semiconductor layer 40, current is injected into the light emitting layer 60. The potential applicator 80 applies potential to the semiconductor layers 20 and 30 in such a way that the potential at the first semiconductor layer 20 is higher than the potential at the second semiconductor layer 30. The current therefore flows from the first electrode 70 toward the second electrode 72. Further, the potential applicator 80 applies potential to the semiconductor layers 20 and 40 in such away that the potential at the first semiconductor layer 20 is lower than or equal to the potential at the third semiconductor layer 40. Preferably, the potential applicator 80 applies potential to the semiconductor layers 20 and 40 in such away that the potential at the first semiconductor layer 20 is lower than the potential at the third semiconductor layer 40. In the light emitter 110, the first semiconductor layer 20 has the first conductivity type (p-type), and the semiconductor layers 30, 40, and 50 each have the second conductivity type (n-type).

The light emitter 110 can provide the same effects as those provided by the light emitter 100.

Further, in the light emitter 110, the first semiconductor layer 20 has the p conductivity type, the third semiconductor layer 40 has the n conductivity type, and the potential applicator 80 applies potential in such a way that the potential at the first semiconductor layer 20 is lower than or equal to the potential at the third semiconductor layer 40. The potential applicator 80 can thus apply reverse bias to the space between the first semiconductor layer 20 and the semiconductor layers 40, 50, whereby the light emitter 110 can more reliably suppress leakage current flowing from the first semiconductor layer 20 toward the semiconductor layers 40, 50.

The above description has been made of the case where the first conductivity type is the p type and the second conductivity type is the n type. Instead, the first conductivity type may be the n type, and the second conductivity type may be the p type. That is, the first semiconductor layer 20 may have then conductivity type, and the semiconductor layers 30, 40, and 50 may have the p conductivity type. In this case, the potential applicator 80 applies potential to the semiconductor layers 20 and 30 in such away that the potential at the first semiconductor layer 20 is lower than the potential at the second semiconductor layer 30. The current therefore flows from the second electrode 72 toward the first electrode 70. Further, the potential applicator 80 applies potential to the semiconductor layers 20 and 40 in such a way that the potential at the first semiconductor layer 20 is higher than or equal to the potential at the third semiconductor layer 40. Preferably, the potential applicator 80 applies potential to the semiconductor layers 20 and 40 in such a way that the potential at the first semiconductor layer 20 is higher than the potential at the third semiconductor layer 40. The potential applicator 80 can thus apply reverse bias to the space between the first semiconductor layer 20 and the semiconductor layers 40, 50, whereby the light emitter 110 can more reliably suppress leakage current flowing from the first semiconductor layer 20 toward the semiconductor layers 40, 50.

In the light emitter 110 according to the variation of the present embodiment, one drive circuit applies potential to the first semiconductor layer 20, the second semiconductor layer 30, and the third semiconductor layer 40, but not necessarily in the invention, and the potential applicator may be formed of a plurality of drive circuits. For example, potential may be applied to the first semiconductor layer 20, the second semiconductor layer 30, and the third semiconductor layer 40 by respective separate drive circuits; potential may be applied to only two of the semiconductor layers by the same drive circuit, and the potential may be applied to the remaining one semiconductor layer by another drive circuit. In this case, it is desirable that the drive circuits share the same reference potential. It is further desirable that the drive circuits operate in synchronization with one another. The potential applicator's application of potential may include grounding. That is, one of the first semiconductor layer 20, the second semiconductor layer 30, and the third semiconductor layer 40 may be grounded, and potential may be applied to the remaining two semiconductor layers from the drive circuit.

2. Second Embodiment

2.1. Light Emitter

Figure 7:
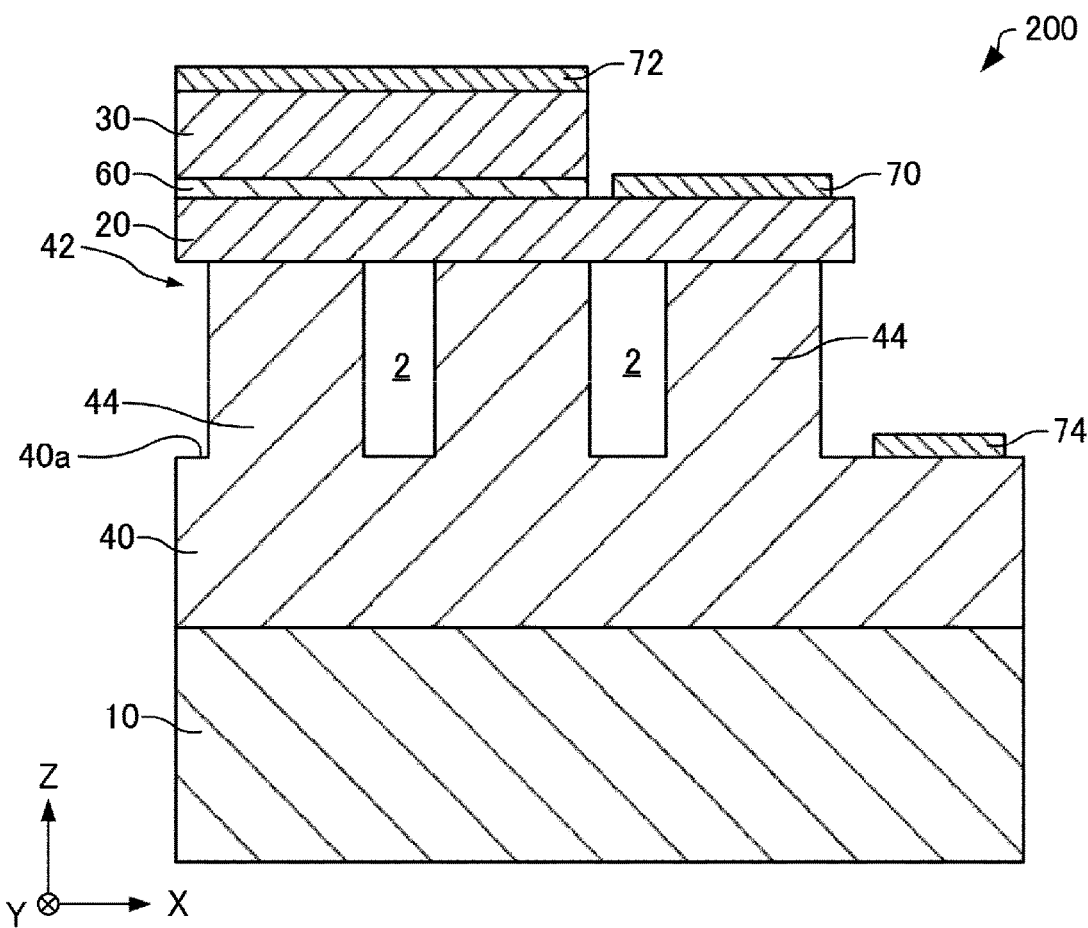
FIG. 7 is a cross-sectional view diagrammatically showing a light emitter according to a second embodiment.
Figure 8:
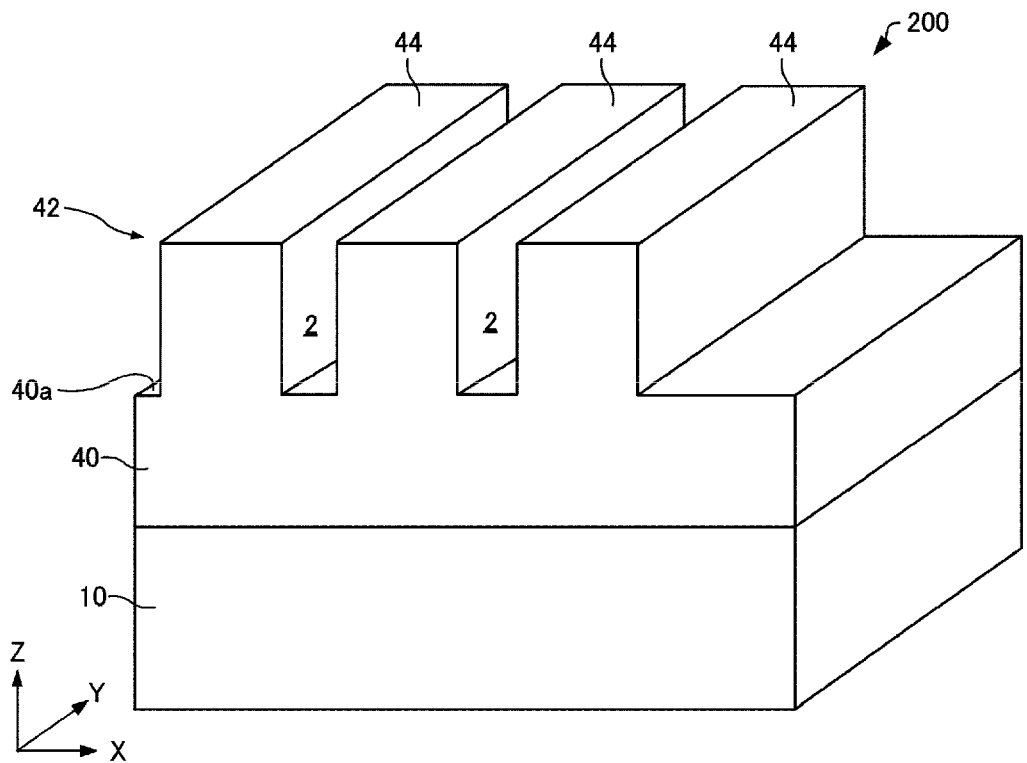
FIG. 8 is a perspective view diagrammatically showing the light emitter according to the second embodiment.

A light emitter according to a second embodiment will next be described with reference to the drawings. FIG. 7 is a cross-sectional view diagrammatically showing a light emitter 200 according to the second embodiment. FIG. 8 is a perspective view diagrammatically showing the light emitter 200 according to the second embodiment. In FIG. 8, the semiconductor layers 20 and 30, the light emitting layer 60, and the electrodes 70, 72, and 74 are omitted for convenience. In FIGS. 7 and 8, axes X, Y, and Z are drawn as three axes perpendicular to one another.

In the following description, a member that forms the light emitter 200 according to the second embodiment and has a function similar to the function of a constituent member of the light emitter 100 according to the first embodiment described above has the same reference character and will not be described in detail.

In the light emitter 100 described above, the third semiconductor layer 40 is separate from the first semiconductor layer 20, as shown in FIG. 1. Further, the light emitter 100 includes the fourth semiconductor layer 50. In contrast, in the light emitter 200, the protrusions 44 of the third semiconductor layer 40 are coupled to the first semiconductor layer 20, as shown in FIG. 7. Further, the light emitter 200 includes no fourth semiconductor layer 50, as shown in FIGS. 7 and 8.

The third semiconductor layer 40 includes a plurality of protrusions 44. The protrusions 44 are each, for example, a columnar portion having a size in the axis-Z direction greater than the size thereof in the axis-X direction. A space 2 is provided between adjacent protrusions 44.

The light emitter 200 can provide the same effects as those provided by the light emitter 100.

Further, in the light emitter 200, the protruding/recessed structure 42 includes the plurality of protrusions 44, and the protrusions 44 are coupled to the first semiconductor layer 20. As a result, in the light emitter 200, the amount of dislocation that occurs in the light emitting layer 60 and the semiconductor layers 20 and 30 can be reduced, whereby the quality of the light emitting layer 60 and the semiconductor layers 20 and 30 can be increased. The light emitter 100 can therefore be characterized, for example, by high efficiency.

Figure 9:
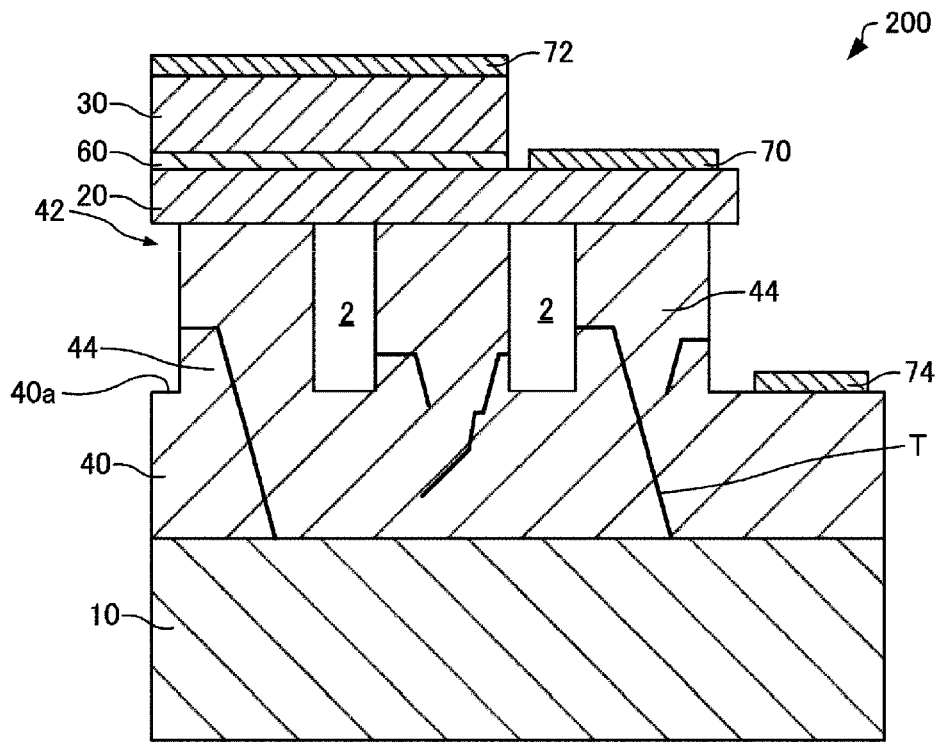
FIG. 9 is a cross-sectional view diagrammatically showing a light emitter according to the second embodiment.

For example, the lattice constant of the substrate 10 differs from the lattice constant of the third semiconductor layer 40, so that dislocation and point defects resulting from lattice strain are present. In a case where the plurality of protrusions 44 are not provided, dislocation is also present in the light emitting layer 60 and the semiconductor layers 20 and 30 in some cases. Providing the plurality of protrusions 44, however, allows dislocation T to move outward via the protrusions 44, as shown in FIG. 9, whereby the amount of dislocation T can be reduced in the area at a fixed height or higher (for example, it is possible that the dislocation T does not substantially exist). The light emitter 200 therefore allows reduction in the amount of dislocation that occurs in the light emitting layer 60 and the semiconductor layers 20 and 30.

In the light emitter 200, the first electrode 70, which is electrically coupled to the first semiconductor layer 20, and the second electrode 72, which is electrically coupled to the second semiconductor layer 30, inject current into the light emitting layer 60. Therefore, in the light emitter 200, no current flows through the protrusions 44, whereby the resistance between the electrodes can be lowered, as compared, for example, with a case where the first semiconductor layer 20 and the third semiconductor layer 40 have the same conductivity type and the electrically coupled to the second semiconductor layer 30 and the electrode electrically coupled to the third semiconductor layer 40 inject current into the light emitting layer 60.

2.2. Method for Manufacturing Light Emitter

A method for manufacturing the light emitter 200 according to the second embodiment will next be described. The method for manufacturing the light emitter 200 according to the second embodiment is basically the same as the method for manufacturing the light emitter 100 according to the first embodiment. The method for manufacturing the light emitter 200 according to the second embodiment will not therefore be described in detail.

2.3. Variation of Light Emitter

Figure 10:
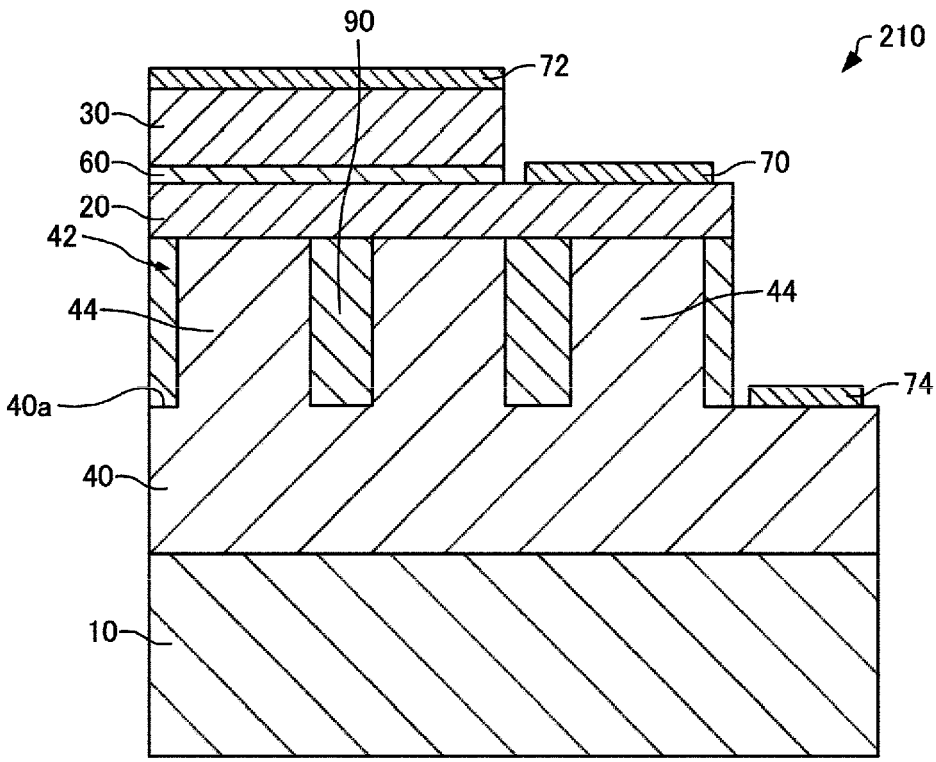
FIG. 10 is a cross-sectional view diagrammatically showing a light emitter according to a variation of the second embodiment.

A light emitter according to a variation of the second embodiment will next be described with reference to the drawings. FIG. 10 is a cross-sectional view diagrammatically showing a light emitter 210 according to the variation of the second embodiment.

In the following description, a member that forms the light emitter 210 according to the variation of the second embodiment and has a function similar to the function of constituent members of the light emitter 100 according to the first embodiment and a constituent member of the light emitter 200 according to the second embodiment described above has the same reference character and will not be described in detail.

In the light emitter 200 described above, the space 2 is provided between adjacent protrusions 44, as shown in FIG. 7. In contrast, in the light emitter 210, a high thermal conductivity member 90, the thermal conductivity of which is higher than that of the protrusions 44, is provided between adjacent protrusions 44, as shown in FIG. 10. The high thermal conductivity members 90 are provided in the portions facing the side edges of the protrusions 44. For example, in a case where the high thermal conductivity members 90 are made of GaN to which Si is doped, setting the concentration of the doped impurity in the high thermal conductivity members 90 to be higher than the concentration of the doped impurity in the protrusions allows the thermal conductivity of the high thermal conductivity members 90 to be higher than the thermal conductivity of the protrusions 44. The refractive index of the high thermal conductivity members 90 may be lower than the refractive index of the protrusions 44.

The high thermal conductivity members 90 are formed, for example, by ELO (epitaxial lateral overgrowth) using MOCVD, MBE, or any other method.

The light emitter 210 can provide the same effects as those provided by the light emitter 100.

Further, in the light emitter 210, the high thermal conductivity members 90, the thermal conductivity of which is higher than that of the protrusions 44, are provided between adjacent protrusions 44. Therefore, in the light emitter 210, heat generated in the light emitting layer 60 can be efficiently dissipated toward the substrate 10. The thus configured heat dissipation, for example, allows not only pulse oscillation but high-power continuous oscillation (CW).

Any variation applied to a constituent portion that form the light emitter 200 according to the second embodiment and is similar to a constituent portion of the light emitter 100 according to the first embodiment is also applicable to the light emitter 200. For example, the light emitters 200 and 210 may each include the potential applicator 80, as does the light emitter 110.

3. Third Embodiment

Figure 11:
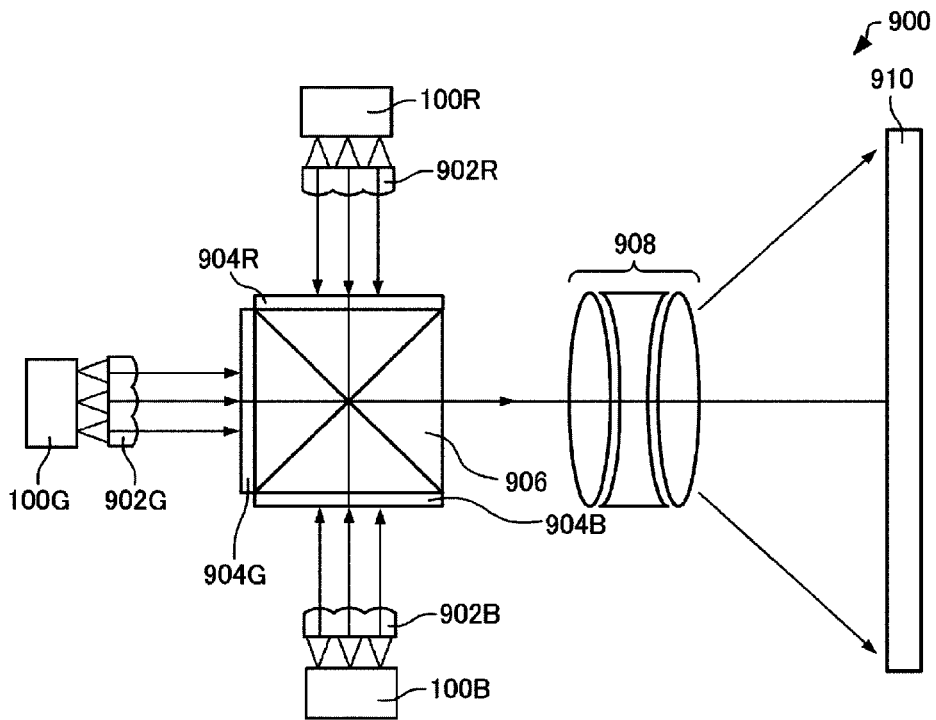
FIG. 11 diagrammatically shows a projector according to a third embodiment.

A projector according to a third embodiment will next be described with reference to the drawings. FIG. 11 diagrammatically shows a projector 900 according to the present embodiment.

The projector according to the invention includes any of the light emitters according to the invention. The following description will be made of a projector 900 including the light emitter 100 as the light emitter according to the invention.

The projector 900 includes a red light source 100R, a green light source 100G, and a blue light source 100B, which output red light, green light, and blue light, respectively, as shown in FIG. 11. The red light source 100R, the green light source 100G, and the blue light source 100B are, for example, each formed of a plurality of light emitters 100 arranged in an array in a plane perpendicular to the layering direction described above (direction in which first semiconductor layer 20 and light emitting layer 60 are layered on each other) with the plurality of light emitters 100 sharing the substrate 10 as a common substrate. The number of light emitters 100 that form each of the light sources 100R, 100G, and 100B is not limited to a specific number. In FIG. 11, an enclosure that forms the projector 900 is omitted, and the light sources 100R, 100G, and 100B are simplified for convenience.

The projector 900 further includes lens arrays 902R, 902G, and 902B, transmissive liquid crystal light valves (light modulator) 904R, 904G, and 904B, and a projection lens (projection apparatus) 908.

Light outputted from the light sources 100R, 100G, and 100B enters the lens arrays 902R, 902G, and 902B, respectively. The light outputted from the light sources 100R, 100G, and 100B can be collected and, for example, (partially) superimposed on one another by the lens arrays 902R, 902G, and 902B. The liquid crystal light valves 904R, 904G, and 904B can thus be uniformly irradiated with the superimposed light.

The light collected by the lens arrays 902R, 902G, and 902B is incident on the liquid crystal light valves 904R, 904G, and 904B, respectively. The liquid crystal light valves 904R, 904G, and 904B each modulate the light incident thereon in accordance with image information. The projection lens 908 then enlarges images formed by the liquid crystal light valves 904R, 904G, and 904B and projects the enlarged images on a screen (display surface) 910.

The projector 900 can further include a cross dichroic prism (light combiner) 906, which combines the light outputted from the liquid crystal light valves 904R, 904G, and 904B with one another and guides the combined light to the projection lens 908.

The three color light fluxes modulated by the liquid crystal light valves 904R, 904G, and 904B enter the cross dichroic prism 906. The prism is formed by bonding four right-angled prisms to each other, and a dielectric multilayer film that reflects the red light and a dielectric multilayer film that reflects the blue light are disposed in the form of across shape on the inner surfaces of the cross dichroic prism. The dielectric multilayer films combine the three color light fluxes to form light representing a color image. The combined light is then projected via the projection lens 908, which is a projection system, on the screen 910. An enlarged image is thus displayed.

The light emitters 100, which form the light sources 100R, 100G, and 100B, may instead be so controlled (light from light emitters 100 is so modulated) as the pixels of video images in accordance with image information that the light sources 100R, 100G, and 100B directly form the video images using none of the liquid crystal light valves 904R, 904G, and 904B. The projection lens 908 may then enlarge the video images formed by the light sources 100R, 100G, and 100B and project the enlarged video images on the screen 910.

In the example described above, transmissive liquid crystal light valves are used as the light modulator. Instead, light valves using no liquid crystal material or reflective light valves may be used. Examples of such light valves may include a reflective liquid crystal light valve and a digital micromirror device. Further, the configuration of the projection system is changed as appropriate in accordance with the type of light valve to be used.

Further, the invention is also applicable to a light source apparatus of a scanning-type image display apparatus (projector) including a scanner that is an image forming device for displaying an image having a desired size on a display surface by scanning the screen with the light from the light sources 100R, 100G, and 100B.

In the invention, part of the configuration thereof may be omitted and the embodiments and the variations may be combined with each other to the extent that the features and effects described in the present application are provided.

The invention encompasses substantially the same configuration as the configuration described in any of the embodiments (for example, a configuration having the same function, using the same method, and providing the same result or a configuration having the same purpose and providing the same effect). Further, the invention encompasses a configuration in which an in essential portion of the configuration described in any of the embodiments is replaced. Moreover, the invention encompasses a configuration that provides the same workings/effects as those provided by the configuration described in any of the embodiments or a configuration that can achieve the same purpose as that achieved by the configuration described in any of the embodiments. Further, the invention encompasses a configuration in which a known technology is added to the configuration described in any of the embodiments.

The invention claimed is:
1. A light emitter comprising:
a substrate;
a first semiconductor layer having a first conductivity type;
a first electrode electrically coupled to the first semiconductor layer, the first electrode being configured to apply a first potential to the first semiconductor layer;
a second semiconductor layer having a second conductivity type different from the first conductivity type;
a second electrode electrically coupled to the second semiconductor layer, the second electrode being configured to apply a second potential to the second semiconductor layer;
a light emitting layer provided between the first semiconductor layer and the second semiconductor layer, the light emitting layer being configured to emit light when current is injected into the light emitting layer, the current being generated by applying the first and sec- ond potentials to the first and second semiconductor layers via the first and second electrodes, respectively;
a third semiconductor layer provided between the substrate and the first semiconductor layer and having the second conductivity type; and
a third electrode electrically coupled to the third semiconductor layer, the third electrode being configured to apply a third potential to the third semiconductor layer,
wherein the first semiconductor layer is provided between the third semiconductor layer and the light emitting layer,
the third semiconductor layer has a protruding/recessed structure, and
leakage of the current from the light emitting layer through the first semiconductor layer into the third semiconductor layer is prevented by the third potential applied via the third electrode and a PN junction between the first semiconductor layer and the third semiconductor layer.

2. The light emitter according to claim 1, further comprising:
a potential applicator configured to apply the first, second, and third potentials to the first, second, and third semiconductor layers via the first, second, and third electrodes, respectively.

3. The light emitter according to claim 2,
wherein the first conductivity type is a p type,
the second conductivity type is an n type, and
the first potential is lower than or equal to the third potential.

4. The light emitter according to claim 2,
wherein the first conductivity type is an n type,
the second conductivity type is a p type, and
the first potential is higher than or equal to the third potential.

5. The light emitter according to claim 1,
further comprising a fourth semiconductor layer provided between the third semiconductor layer and the first semiconductor layer.

6. The light emitter according to claim 1,
wherein the protruding/recessed structure includes a plurality of protrusions, and
the plurality of protrusions are coupled to the first semiconductor layer.

7. The light emitter according to claim 2,
further comprising a fourth semiconductor layer provided between the third semiconductor layer and the first semiconductor layer.

8. The light emitter according to claim 2,
wherein the protruding/recessed structure includes a plurality of protrusions, and
the plurality of protrusions are coupled to the first semiconductor layer.

9. The light emitter according to claim 3,
further comprising a fourth semiconductor layer provided between the third semiconductor layer and the first semiconductor layer.

10. The light emitter according to claim 3,
wherein the protruding/recessed structure includes a plurality of protrusions, and
the plurality of protrusions are coupled to the first semiconductor layer.

11. The light emitter according to claim 4,
further comprising a fourth semiconductor layer provided between the third semiconductor layer and the first semiconductor layer.

12. The light emitter according to claim 4,
wherein the protruding/recessed structure includes a plurality of protrusions, and
the plurality of protrusions are coupled to the first semiconductor layer.

13. A projector comprising:
a light emitter, the light emitter including:
a substrate;
a first semiconductor layer having a first conductivity type;
a first electrode electrically coupled to the first semiconductor layer, the first electrode being configured to apply a first potential to the first semiconductor layer;
a second semiconductor layer having a second conductivity type different from the first conductivity type;
a second electrode electrically coupled to the second semiconductor layer, the second electrode being configured to apply a second potential to the second semiconductor layer;
a light emitting layer provided between the first semiconductor layer and the second semiconductor layer, the light emitting layer being configured to emit light when current is injected into the light emitting layer, the current being generated by applying the first and second potentials to the first and second semiconductor layers via the first and second electrodes, respectively;
a third semiconductor layer provided between the substrate and the first semiconductor layer and having the second conductivity type; and
a third electrode electrically coupled to the third semiconductor layer, the third electrode being configured to apply a third potential to the third semiconductor layer;
a light modulator configured to modulate the light from the light emitter; and
a projection member configured to project the modulated light,
wherein the first semiconductor layer is provided between the third semiconductor layer and the light emitting layer,
the third semiconductor layer has a protruding/recessed structure, and
leakage of the current from the light emitting layer through the first semiconductor layer into the third semiconductor layer is prevented by the third potential applied via the third electrode and a PN junction between the first semiconductor layer and the third semiconductor layer.

14. A light emitter comprising:
a substrate;
a first semiconductor layer having a first conductivity type;
a first electrode electrically coupled to the first semiconductor layer, the first electrode being configured to apply a first potential to the first semiconductor layer;
a second semiconductor layer having a second conductivity type different from the first conductivity type;
a second electrode electrically coupled to the second semiconductor layer, the second electrode being configured to apply a second potential to the second semiconductor layer;
a light emitting layer provided between the first semiconductor layer and the second semiconductor layer, the light emitting layer being configured to emit light when current is injected into the light emitting layer;

a third semiconductor layer provided between the substrate and the first semiconductor layer and having the second conductivity type; and a third electrode electrically coupled to the third semiconductor layer, the third electrode being configured to apply a third potential to the third semiconductor layer, wherein the first semiconductor layer is provided between the third semiconductor layer and the light emitting layer, the third semiconductor layer has a protruding/recessed structure, the protruding/recessed structure includes a plurality of columnar portions protruding along a layering direction in which the first semiconductor layer and the light emitting layer are layered, the plurality of columnar portions are coupled to the first semiconductor layer, a height along the layering direction of each of the plurality of columnar portions is larger than a width along a first direction of each of the plurality of columnar portions, and the first direction is perpendicular to the layering direction, the current is generated by applying the first and second potentials to the first and second semiconductor layers via the first and second electrodes, respectively, and leakage of the current from the light emitting layer through the first semiconductor layer into the third semiconductor layer is prevented by the third potential applied via the third electrode and a PN junction between the first semiconductor layer and the third semiconductor layer.

15. The light emitter according to claim 14, further comprising:
a potential applicator configured to apply the first, second, and third potentials to the first, second, and third semiconductor layers via the first, second, and third electrodes, respectively.

16. The light emitter according to claim 14,
wherein the first conductivity type is a p type,
the second conductivity type is an n type, and
the first potential is lower than or equal to the third potential.

17. The light emitter according to claim 14,
wherein the first conductivity type is an n type,
the second conductivity type is a p type, and
the first potential is higher than or equal to the third potential.

18. The light emitter according to claim 14,
wherein a space is provided between adjacent two columnar portions of the plurality of columnar portions along the first direction.

19. The light emitter according to claim 16,
wherein a space is provided between adjacent two columnar portions of the plurality of columnar portions along the first direction.

* * * * *